(12) United States Patent
He et al.

(10) Patent No.: US 11,309,452 B2
(45) Date of Patent: Apr. 19, 2022

(54) PATTERNING METHOD OF QUANTUM DOT LAYER, QUANTUM DOT DEVICE AND MANUFACTURING METHOD THEREOF

(71) Applicant: BOE TECHNOLOGY GROUP CO., LTD., Beijing (CN)

(72) Inventors: Wei He, Beijing (CN); Xiang Li, Beijing (CN); Huili Wu, Beijing (CN); Shipei Li, Beijing (CN); Fang He, Beijing (CN); Renquan Gu, Beijing (CN); Sheng Xu, Beijing (CN); Dongsheng Yin, Beijing (CN); Xuefei Zhao, Beijing (CN); Lizhen Zhang, Beijing (CN); Wusheng Li, Beijing (CN); Qi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/601,472

(22) Filed: Oct. 14, 2019

(65) Prior Publication Data
US 2020/0313037 A1    Oct. 1, 2020

(30) Foreign Application Priority Data
Mar. 26, 2019    (CN) .......................... 201910232123.0

(51) Int. Cl.
*H01L 33/06*    (2010.01)
*H01L 27/15*    (2006.01)
(Continued)

(52) U.S. Cl.
CPC ............ *H01L 33/06* (2013.01); *H01L 27/156* (2013.01); *H01L 33/502* (2013.01); *B82Y 20/00* (2013.01); *H01L 2933/0041* (2013.01)

(58) Field of Classification Search
CPC ..... H05B 33/145; H01L 33/06; H01L 33/502; H01L 27/156; H01L 33/504;
(Continued)

(56) References Cited

U.S. PATENT DOCUMENTS

| 8,993,995 B2 | 3/2015 | Miyata |
| 9,947,842 B2 | 4/2018 | Li |

(Continued)

FOREIGN PATENT DOCUMENTS

| CN | 102907176 A | 1/2013 |
| CN | 105301827 A | 2/2016 |

(Continued)

OTHER PUBLICATIONS

Chinese Office Action in Chinese Application No. 201910232123.0, dated Sep. 30, 2020 with English translation.

(Continued)

*Primary Examiner* — Mouloucoulaye Inoussa
(74) *Attorney, Agent, or Firm* — Collard & Roe, P.C.

(57) ABSTRACT

A patterning method of a quantum dot layer, a quantum dot layer pattern, a quantum dot device, a manufacturing method of the quantum dot device, and a display apparatus are provided. The patterning method of the quantum dot layer includes: forming a quantum dot layer, in which the quantum dot layer includes quantum dots and a photoinitiator; irradiating a preset portion of the quantum dot layer by light having a preset wavelength to quench the quantum dots in the preset portion and form a patterned quantum dot layer.

14 Claims, 6 Drawing Sheets

(51) Int. Cl.
*H01L 33/50* (2010.01)
*B82Y 20/00* (2011.01)

(58) Field of Classification Search
CPC ..... H01L 33/505; H01L 33/508; C09K 11/02; C09K 11/883; C09K 11/70; C09K 11/025; F21V 9/08; B05D 1/005; B05D 3/06; B05D 3/107; B05D 3/145; G03F 7/0007; G03F 7/042; G03F 7/033; G03F 7/105; G03F 7/2032; G03F 7/162; G03F 7/38; G03F 7/322; G03F 7/0397; G02F 1/133516; G02F 1/133514; G02F 1/133617; G02F 1/133614; G02F 1/133615; G02B 6/0065; G02B 6/0035; G02B 6/0061; G02B 5/207; G02B 5/201; C08F 212/08; C08F 220/1818; C09D 125/14; C08K 3/04; C09C 1/56

See application file for complete search history.

(56) References Cited

U.S. PATENT DOCUMENTS

| | | | |
|---|---|---|---|
| 10,263,220 B2 | 4/2019 | Liu | |
| 2017/0010405 A1* | 1/2017 | Lee | G02B 6/0035 |
| 2017/0052450 A1* | 2/2017 | Nakagawa | G03F 7/091 |
| 2017/0088687 A1* | 3/2017 | Wu | C08F 212/08 |
| 2017/0115571 A1* | 4/2017 | Kato | G03F 7/40 |
| 2017/0136490 A1* | 5/2017 | Sanchot | H01L 33/505 |
| 2017/0158954 A1* | 6/2017 | Yang | G03F 7/0007 |
| 2017/0256686 A1* | 9/2017 | Li | H01L 33/44 |
| 2018/0105739 A1* | 4/2018 | Kim | G03F 7/162 |
| 2018/0219185 A1* | 8/2018 | Liu | H01L 27/3248 |
| 2018/0275452 A1* | 9/2018 | Wang | G02F 1/133512 |
| 2019/0055465 A1 | 2/2019 | Park et al. | |
| 2020/0272051 A1* | 8/2020 | Ho | G03F 7/0388 |

FOREIGN PATENT DOCUMENTS

| | | |
|---|---|---|
| CN | 106356463 A | 1/2017 |
| CN | 107394020 A | 11/2017 |
| CN | 107706313 A | 2/2018 |
| WO | 02/11209 A2 | 2/2002 |

OTHER PUBLICATIONS

Chinese Office Action in Chinese Application No. 201910232123.0, dated Feb. 9, 2021 with English translation.

* cited by examiner

PATTERNING METHOD OF QUANTUM DOT LAYER, QUANTUM DOT DEVICE AND MANUFACTURING METHOD THEREOF

The present application claims the priority of the Chinese Patent Application No. 201910232123.0, filed on Mar. 26, 2019, the disclosure of which is incorporated herein by reference in its entirety as a part of the present application.

TECHNICAL FIELD

Embodiments of the present disclosure relate to a patterning method of a quantum dot layer, a quantum dot layer pattern, a quantum dot device and manufacturing method thereof and a display apparatus.

BACKGROUND

Quantum dots (QDs) are quasi-zero dimensional nanomaterials, because sizes of the quantum dots in three dimensions are from 1 nm to 10 nm respectively. Movement of electrons in the quantum dots in all directions is limited, so that a quantum confinement effect is particularly obvious. For the quantum dots having different sizes, an extent to which electrons are quantum confined is different from an extent to which holes are quantum confined. Therefore, after the quantum dots are excited by external energy, quantum dots having different sizes emit light with different wavelengths, that is, the quantum dots having different sizes emit light with different colors. Moreover, color gamut of the display device using the quantum dot light-emitting materials is very high, so display quality of a quantum dot display device is also very good.

With the development of quantum dot fabrication technology, the stability of the quantum dots and the light-emitting efficiency of the quantum dots are continuously improved, the research of a quantum dot light-emitting diode (QLED) continues to deepen, and the QLED is more and more widely used in a display field.

SUMMARY

At least one embodiment of the present disclosure provides a patterning method of a quantum dot layer, and the patterning method comprises: forming a quantum dot layer, in which the quantum dot layer comprises quantum dots and a photoinitiator; irradiating a preset portion of the quantum dot layer by light having a preset wavelength to quench the quantum dot in the preset portion and form a patterned quantum dot layer.

For example, the patterning method of the quantum dot layer provided by at least one embodiment of the present disclosure, further comprises: removing the photoinitiator in remaining portions of the quantum dot layer other than the preset portion after the preset portion of the quantum dot layer is irradiated by the light having the preset wavelength.

For example, the patterning method of the quantum dot layer provided by at least one embodiment of the present disclosure, further comprises: performing a pre-baking treatment on the quantum dot layer before the preset portion of the quantum dot layer is irradiated by the light having the preset wavelength; performing a post-baking treatment on the quantum dot layer after the preset portion of the quantum dot layer is irradiated by the light having the preset wavelength.

For example, in the patterning method of the quantum dot layer provided by at least one embodiment of the present disclosure, the photoinitiator in the remaining portions of the quantum dot layer other than the preset portion is removed by the post-baking treatment.

For example, in the patterning method of the quantum dot layer provided by at least one embodiment of the present disclosure, a boiling point of the photoinitiator is higher than a temperature of the pre-baking treatment and lower than a temperature of the post-baking treatment.

For example, in the patterning method of the quantum dot layer provided by at least one embodiment of the present disclosure, before the preset portion of the quantum dot layer is irradiated by the light having the preset wavelength, the patterning method further comprises: adjusting a focal plane and a focal depth of the preset portion of the quantum dot layer in a case that the light having the preset wavelength irradiates the preset portion of the quantum dot layer, such that the focal plane is located on an upper surface of the preset portion of the quantum dot layer in a thickness direction of the preset portion of the quantum dot layer, and the focal depth is twice of a thickness of the preset portion of the quantum dot layer.

For example, in the patterning method of the quantum dot layer provided by at least one embodiment of the present disclosure, the irradiating the preset portion of the quantum dot layer by the light having the preset wavelength comprises: shielding the quantum dot layer by a mask plate, and the mask plate comprises a light-transmitting region and a light-shielding region, the light-transmitting region corresponds to the preset portion of the quantum dot layer, and the light-shielding region corresponds to the remaining portions of the quantum dot layer other than the preset portion.

For example, in the patterning method of the quantum dot layer provided by at least one embodiment of the present disclosure, the light having the preset wavelength is ultraviolet light, and the photoinitiator is an ultraviolet photoinitiator.

For example, in the patterning method of the quantum dot layer provided by at least one embodiment of the present disclosure, a molecular formula of the photoinitiator is R1(CO)R2, in which R1 comprises at least one selected from the group consisting of phenyl group, substituted phenyl group, aromatic group and substituted aromatic group, and R2 comprises at least one selected from the group consisting of alkyl group and substituted alkyl group.

For example, in the patterning method of the quantum dot layer provided by at least one embodiment of the present disclosure, the photoinitiator comprises at least one selected from the group consisting of 2,2-diethoxyacetophenone, 1-hydroxycyclohexyl phenylketone, 2-hydroxy-2-methyl-1-phenyl-1-acetone, 2-methyl-1-(4-methylthiophenyl)-2-morpholine-1-acetone, 2-dimethylamino-2-benzyl-1-[4-(4-morpholinyl) phenyl]-1-butanone, and 2-hydroxy-2-methyl-1-[4-(2-hydroxyethyl)phenyl]-1-acetone.

At least one embodiment of the present disclosure further provides a manufacturing method of a quantum dot device, and the manufacturing method comprises: forming a plurality of patterned quantum dot layers according to any one of the patterning methods mentioned above, the plurality of the patterned quantum dot layers are arranged in a stacked manner, and each of the plurality of patterned quantum dot layers comprises an inactive portion and an active portion, the inactive portion corresponds to the preset portion, and the active portion corresponds to the remaining portions of the quantum dot layer other than the preset portion.

For example, in the manufacturing method provided in at least one embodiment of the present disclosure, colors of light emitted by the active portions of the plurality of the patterned quantum dot layers are different from each other; and the active portions of the plurality of the patterned quantum dot layers are not overlapped with each other in a stacking direction of the plurality of the patterned quantum dot layers.

For example, the manufacturing method provided by at least one embodiment of the present disclosure, further comprises: forming a plurality of first electrodes spaced apart from each other before the plurality of the patterned quantum dot layers are formed, in which the active portions of the plurality of the patterned quantum dot layers overlap with the plurality of the first electrodes respectively in a stacking direction of the plurality of the patterned quantum dot layers.

For example, the manufacturing method provided by at least one embodiment of the present disclosure, further comprises: forming a second electrode to cover the plurality of the patterned quantum dot layers after the plurality of the patterned quantum dot layers are formed.

For example, in the manufacturing method provided by at least one embodiment of the present disclosure, the light having the preset wavelength is ultraviolet light, and the photoinitiator is an ultraviolet photoinitiator, and the manufacturing method further comprises: forming an ultraviolet light isolation layer on at least a side of the plurality of the patterned quantum dot layers.

At least one embodiment of the present disclosure further provides a quantum dot layer pattern, and the quantum dot layer pattern comprises: an inactive portion and an active portion, in which quantum dots in the inactive portion are quenched.

At least one embodiment of the present disclosure further provides a quantum dot device, and the quantum dot device comprises: a plurality of quantum dot layer patterns arranged in a stacked manner, in which each of the patterned quantum dot layers comprises an inactive portion and an active portion, and the quantum dots in the inactive portion are quenched.

For example, in the quantum dot device provided by at least one embodiment of the present disclosure, colors of light emitted by the active portions of the plurality of the patterned quantum dot layers are different from each other; and the active portions of the plurality of the patterned quantum dot layers are not overlapped with each other in a stacking direction of the plurality of the patterned quantum dot layers.

For example, the quantum dot device provided by at least one embodiment of the present disclosure further comprises: an ultraviolet light isolation layer arranged on at least a side of the plurality of the patterned quantum dot layers.

At least one embodiment of the present disclosure further provides a display apparatus, and the display apparatus comprises any one of the quantum dot devices mentioned above.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

REFERENCE NUMERALS 11, 21, 31, 201—base substrate; 12, 22—quantum dot layer; 12', 22'—patterned quantum dot layer; 121, 221, 421, 621—preset portion; 13, 23—quantum dots; 14, 24—mask plate; 44, 64—second mask plate; 141, 241, 441, 641—light-transmitting region; 142, 242, 442, 642—light-shielding region; 32—first quantum dot layer; 32'—first patterned quantum dot layer; 42, 62—second quantum dot layer; 42', 62'—second patterned quantum dot layer; 43,63—second quantum dots; 52—third quantum dot layer; 52'—third patterned quantum dot layer; 53—third quantum dots; 100—quantum dot layer pattern; 101—inactive portion; 102, 2052, 2062, 2072—active portion; 200—quantum dot device; 202—first electrode; 203—hole injection layer; 204—hole transport layer; 205—first quantum dot layer pattern; 206—second quantum dot layer pattern; 207—third quantum dot layer pattern; 208—electron transport layer; 209—electron injection layer; 210—second electrode layer; 211—ultraviolet light isolation layer; 300—display apparatus; 301—thin film transistor; 3011—first source drain electrode; 3012—gate electrode; 3013—active layer; 3014—second source drain electrode; 302—pixel definition layer; 305—passivation layer; 306—encapsulation layer.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect," "connected," etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

A quantum dot light-emitting diode (QLED) is an active electroluminescent device where quantum dots are used in a display. Similar to an organic light-emitting diode (OLED), the QLED is also a self-luminescent diode. Different from the manufacturing of the light-emitting layer in the OLED, inorganic quantum dot materials cannot be patterned and vaporized to form a patterned quantum dot layer.

In general, a patterned quantum dot layer is manufactured by an inkjet printing method. In a case that the patterned quantum dot layer manufactured by the inkjet printing method is used in a display apparatus, the display apparatus usually has a low resolution. In order to increase the resolution of the display apparatus, a patterned quantum dot layer is currently formed by photolithography process. Because it is prone to affect the performance of the quantum dots during the photolithography process, it is difficult to prepare a colored quantum dot electroluminescent device having high pixel density. At present, most of the quantum dot electroluminescent devices are monochrome devices with low pixel density.

Inventors of the present disclosure note that, a colored quantum dot light-emitting device with high pixel density can be formed by the following processes: the photoinitiator is added in the quantum dot layer, the mask plate is used to shield the quantum dot layer, and then light having the preset wavelength is used to irradiate the quantum dots in a preset portion of the quantum dot layer to quench the quantum dots in the preset portion. The quantum dots shielded by the mask plate remain in the quantum dot layer and are used to form a fine pattern of the quantum dot light-emitting layer, and thus the colored quantum dot light-emitting device with high pixel density is formed.

For example, normal quantum dots are able to convert electrical energy into light energy with a corresponding wavelength. After the quantum dots are quenched, the quantum dots only convert the electrical energy into phonons or heat energy. The quenching of the quantum dots is a process of a cross-linking reaction occurring between surface groups of the quantum dot to make a whole size of the quantum dot becomes larger after agglomeration, and finally the quantum dots cannot convert the electrical energy into light energy.

Figure 1:
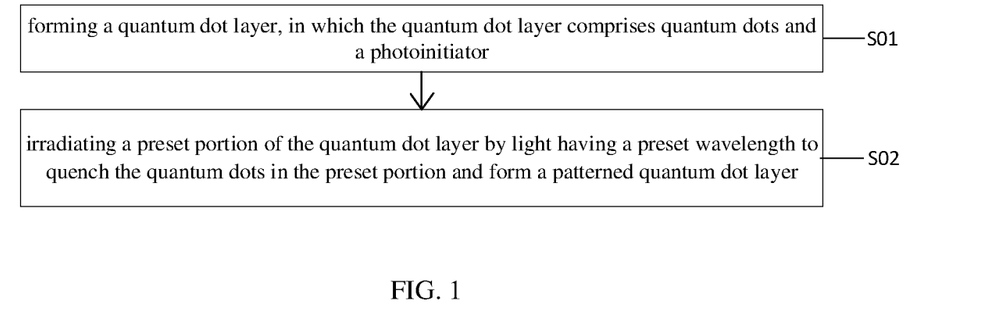
FIG. 1 is a flowchart, of a patterning method of a quantum dot layer provided by an embodiment of the present disclosure.

At least one embodiment of the present disclosure provides a patterning method of a quantum dot layer. For example, FIG. 1 is a flowchart of a patterning method of a quantum dot layer provided by an embodiment of the present disclosure. As illustrated in FIG. 1, the patterning method comprises the follows.

S01: forming a quantum dot layer, in which the quantum dot layer comprises quantum dots and a photoinitiator.

For example, the quantum dots are made of semiconductor compound formed of elements from IIB group to VIA group, and the semiconductor compound is a binary compound, a ternary compound or a quaternary compound, such as at least one selected from the group consisting of CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, CdZnSeS, CdZnSeTe, CdZnSTe, CdHgSeS, CdHgSeTe, CdHgSTe, HgZnSeS, HgZnSeTe, and HgZnSTe. In a case that the quantum dots are excited by blue light source, the quantum dots emit excitation fluorescence with a specific wavelength. The fluorescence spectrum is determined by chemical composition and particle size of the quantum dot material. As the particle size of the quantum dot material increases, the fluorescence spectrum emitted by the same chemical composition is red-shifted from green light to red light. The quantum dot material for emitting red light and the quantum dot material for emitting green light may be quantum dot materials having same chemical composition but different in particle sizes, or the quantum dot material for emitting the red light and the quantum dot material for emitting the green light are quantum dot materials having different chemical compositions.

For example, each of the quantum dots is a nano-scale semiconductor material. By applying a certain electric field or a certain optical pressure to a nano-scale semiconductor material, the nano-scale semiconductor material emits light with a specific frequency. The frequency of the emitted light varies with the changes of sizes of the semiconductor material, so that the color of the emitted light is controlled by adjusting the average size of the quantum dots.

For example, by controlling a shape, a structure, and an average size of the quantum dots, it is easy to adjust an energy gap width of the quantum dots, an amount of binding energy of an exciton, energy blue shift of the exciton, or other electronic states. As the average size of the quantum dots decreases, a spectrum of the quantum dot shows blue shift. The smaller the average size of the quantum dots are, the more significant of a blue shift phenomenon is. For example, for a cadmium selenide (CdSe) quantum dot, in a case that a size of the CdSe quantum dot is reduced from 10 nm to 2 nm, the color of light emitted by the CdSe quantum dot changes from red to blue. In a case that the size of the CdSe quantum dot is larger than or equal to 2 nm and less than 5 nm, the CdSe quantum dot emits blue light; in a case that the size of the CdSe quantum dot is larger than or equal to 5 nm and less than 8 nm, the CdSe quantum dot emits green light; and in a case that the size of the CdSe quantum dot is larger than or equal to 8 nm and less than 10 nm, the CdSe quantum dot emits red light.

For example, unique properties of the quantum dots are based on their own quantum size effect. In a case that the size of a particle is in nanometer scale, dimensional confinement causes size effect, quantum confinement effect, macroscopic quantum tunneling effect, and surface effect, in this way, a nano-system having low-dimensional physical property different from that of a microscopic system is derived, so that the quantum dots in the nanometer scale has different physical properties and chemical properties from the microscopic system. For example, the quantum dots have unique photoluminescence properties and electroluminescence properties due to the quantum size effect and an electrical confinement effect. Compared with organic fluorescent dyes, the quantum dots have excellent optical properties, such as high quantum yield, high photochemistry stability, not easily to be photolyzed, wide excitation, narrow emission, high color purity and color of the emitted light is adjustable by controlling the average size of the quantum dots. Thus, a quantum dot device including a quantum dot light-emitting layer has advantages of high luminous efficiency, good stability, long lifetime, high brightness and wide gamut.

For example, according to the light having different preset wavelengths, the photoinitiator is adjustable, as long as the quantum dots absorb a certain amount of energy in a certain wavelength region to generate free radicals, and then the quantum dots are quenched after agglomeration. For example, the photoinitiator is an ultraviolet photoinitiator, and the light having the preset wavelength is ultraviolet light.

For example, a molecular formula of the photoinitiator is R1(CO)R2, in which R1 comprises at least one selected from the group consisting of phenyl group, substituted phenyl group, aromatic group, and substituted aromatic group, and R2 comprises at least one selected from the group consisting of alkyl group and substituted alkyl group. A bond energy of a carbonyl group corresponds to an energy range of the ultraviolet light, and the photoinitiator having the above molecular formula allow the free radicals to generate on the surface of the quantum dots under the ultraviolet light irradiation, as a result, the photoinitiator has a certain stability.

For example, the photoinitiator comprises at least one selected from the group consisting of 2,2-diethoxyacetophenone, 1-hydroxycyclohexyl phenylketone, 2-hydroxy-2-methyl-1-phenyl-1-acetone, 2-methyl-1-(4-methylthiophenyl)-2-morpholine-1-acetone, 2-dimethylamino-2-benzyl-1-[4-(4-morpholinyl) phenyl]-1-butanone and 2-hydroxy-2-methyl-1-[4-(2-hydroxyethyl)phenyl]-1-acetone.

For example, in a case that the photoinitiator is a liquid photoinitiator, the photoinitiator having a boiling point of 70° C. to 170° C. is selected.

For example, the quantum dot layer further includes a thickener, a coupling agent, an accelerator and so on, and the proportion of the thickener, the coupling agent and the accelerator in the quantum dot layer are adjustable as requirements.

For example, the thickener comprises at least one selected from the group consisting of methyl vinyl MQ silicone resin, polymethacrylate, and polycyanoacrylate.

For example, the methyl vinyl MQ silicone resin is a long chain spherical molecular structure, which is a three-dimensional (non-linear) structure based on Si—O bonds, and the methyl vinyl MQ silicone resin has a high light transmittance property and a good film-forming property. The methyl vinyl MQ silicone resin acting as a thickener is added to the quantum dot layer, so that the quantum dot layer has excellent properties, such as a good mechanical property, a high temperature resistance property, a low temperature resistance property, an electrical insulation property, a moisture resistance property, and a water resistance property.

For example, the coupling agent comprises at least one selected from the group consisting of vinyl trimethoxysilane, vinyl triethoxysilane, and vinyl tri-(2-methoxyethoxy) silane.

For example, the accelerator comprises at least one selected from the group consisting of N,N-dimethylaniline, N,N-dimethyl-p-toluidine, or 2,4,6-tris(dimethylaminomethyl)phenol.

S02: irradiating a preset portion of the quantum dot layer by using light having a preset wavelength so as to quench the quantum dots in the preset portion and form a patterned quantum dot layer.

For example, irradiating the preset portion of the quantum dot layer by using the light having the preset wavelength comprises: shielding the quantum dot layer by a mask plate, and the mask plate comprises a light-transmitting region and a light-shielding region, the light-transmitting region corresponds to the preset portion of the quantum dot layer, and the light-shielding region corresponds to the remaining portions of the quantum dot layer other than the preset portion. The method of illuminating the quantum dot layer while shielding the quantum dot layer by the mask plate makes the pattern of the patterned quantum dot layer more precise.

For example, the preset portion of the quantum dot layer is irradiated by light with a wavelength of 193 nm to 400 nm. The quantum dots in the preset portion of the quantum dot layer absorb a certain amount of energy under the illumination of the light to generate free radicals, and finally the quantum dots are agglomerated and then quenched.

For example, the finally formed quantum dot layer includes an inactive portion and an active portion, the inactive portion corresponds to the preset portion, and the active portion corresponds to the remaining portions of the quantum dot layer other than the preset portion. The quantum dots in the preset portion of the quantum dot layer absorb a certain amount of energy under the illumination of the light to generate free radicals, and finally the quantum dots in the preset portion are agglomerated and then quenched.

For example, in order to prevent the light having the preset wavelength to illuminate the pattern of the quantum dot layer in the subsequent process again, which makes an undesirable phenomenon that the quantum dots in the active portion are also quenched, the patterning method of the quantum dot layer further comprises: removing the photoinitiator in the remaining portions of the quantum dot layer other than the preset portion, after the preset portion of the quantum dot layer is irradiated by the light having the preset wavelength. In this way, the phenomena that the light having the preset wavelength irradiates the quantum dot layer again to make the active portion of the quantum dot layer generate free radicals, finally quench the quantum dots in the active portion, and make the quantum dot layer lose the function of illuminating are avoided.

For example, the photoinitiator in the remaining portions of the quantum dot layer other than the preset portion of the quantum dot layer is removed by heat treatment, as long as the heating temperature is higher than the boiling point of the photoinitiator, and the heating temperature does not affect the normal illumination of the quantum dots.

For example, the patterning method of the quantum dot layer further comprises: performing a pre-baking treatment on the quantum dot layer before the preset portion of the quantum dot layer is irradiated by the light having the preset wavelength; and performing a post-baking treatment on the quantum dot layer after the preset portion of the quantum dot layer is irradiated by the light having the preset wavelength.

For example, the temperature of the pre-baking treatment is approximately from 60° C. to 80° C., and the temperature of the post-baking treatment is approximately from 160° C. to 180° C.

For example, in the patterning method of the quantum dot layer, in a case that the boiling point of the photoinitiator is higher than the temperature of the pre-baking treatment and lower than the temperature of the post-baking treatment, the photoinitiator in the remaining portions of the quantum dot layer other than the preset portion is removed by the post-baking treatment.

For example, in the patterning method of the quantum dot layer, before the light having the preset wavelength irradiates the preset portion of the quantum dot layer, the patterning method further comprises: adjusting a focal plane and a focal depth of the preset portion of the quantum dot layer while the light having the preset wavelength irradiates the preset portion of the quantum dot layer, so as to make that the focal plane is located on an upper surface of the preset portion of the quantum dot layer in a thickness direction of the preset portion of the quantum dot layer, and the focal depth is twice of a thickness of the preset portion of the quantum dot layer. In this way, the light having the preset wavelength only irradiates the preset portion of the quantum dot layer, and a depth through which the light having the preset wavelength illuminates is a thickness of the preset portion of the quantum dot layer, the remaining portions other than the preset portion of the quantum dot layer is not illuminated by the light having the preset wavelength.

For example, FIG. 2(a) to FIG. 2(e) are process diagrams of a patterning method of a quantum dot layer provided by an embodiment of the present disclosure. As illustrated in FIG. 2(a) to FIG. 2(e), the patterning method of the quantum dot layer is as follows.

Figure 2A:
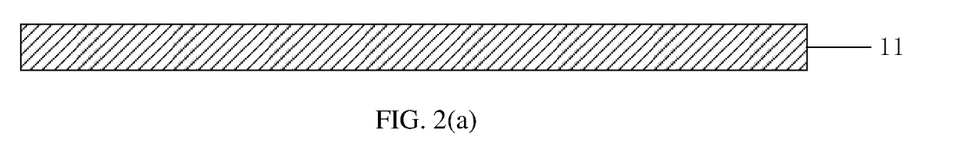
FIG. 2(a) to FIG. 2(e) are process diagrams of a patterning method of a quantum dot layer provided by an embodiment of the present disclosure.

As illustrated in FIG. 2(a), a base substrate 11 is provided.

For example, the base substrate 11 is a glass substrate, a quartz substrate or other substrate.

Figure 2B:
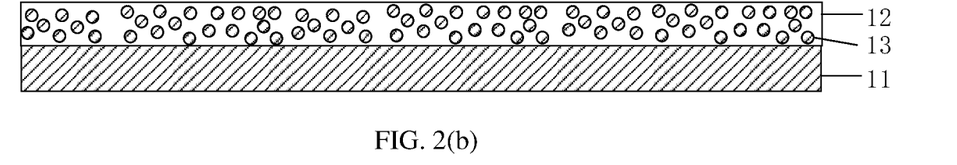

As illustrated in FIG. 2(b), a quantum dot layer 12 is formed on the base substrate 11.

For example, the quantum dot layer 12 is formed on the base substrate 11 by a coating method, a transferring method, a printing method or other methods, and the quantum dot layer 12 comprises the quantum dots 13 and the photoinitiator (not illustrated in FIG. 2(b)).

Figure 2C:
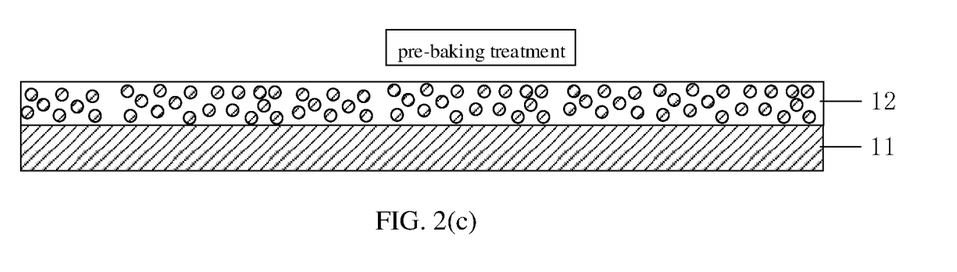

As illustrated in FIG. 2(c), a pre-baking treatment is performed on the quantum dot layer 12.

For example, the temperature of the pre-baking treatment for the quantum dot layer 12 is approximately from 60° C. to 80° C. The pre-baking treatment removes most of the solvent in the quantum dot layer 12 to ensure that the quantum dot layer 12 does not have fluidity and forms a basic layer structure.

Figure 2D:
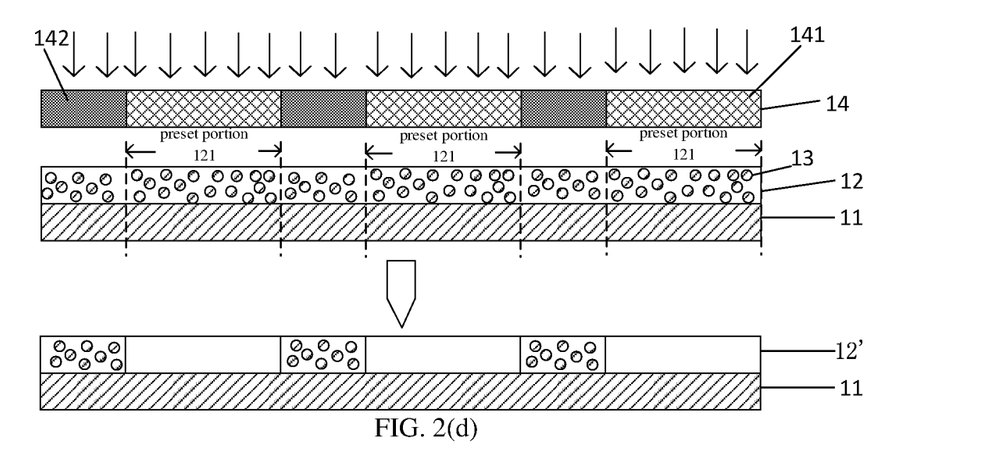

As illustrated in FIG. 2(d), the preset portion 121 of the quantum dot layer 12 is irradiated by the light having the preset wavelength, and thus the quantum dots 13 in the preset portion 121 are quenched to form a patterned quantum dot layer 12'.

For example, a mask plate 14 is used to shield the quantum dot layer 12, and the mask plate 14 comprises a light-transmitting region 141 and a light-shielding region 142, the light-transmitting region 141 corresponds to the preset portion 121 of the quantum dot layer 12, and the light-shielding region 14:2 corresponds to the remaining portions of the quantum dot layer 12 other than the preset portion 121. The method of illuminating the quantum dot layer 12 while shielding the quantum dot layer 12 by the mask plate 14 makes the pattern of the patterned quantum dot layer 12' more precise.

Figure 2E:
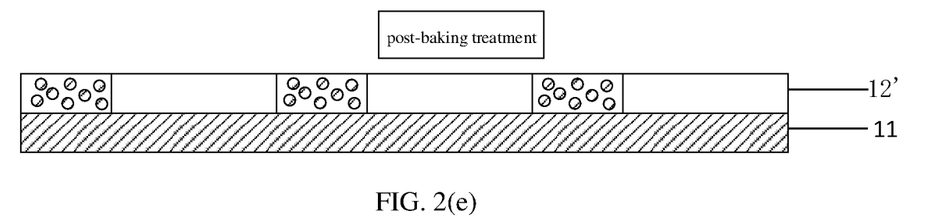

As illustrated in FIG. 2(e), a post-baking treatment is performed on the patterned quantum dot layer 12'.

For example, the post-baking treatment removes the residual solvents in the patterned quantum dot layer 12' to maintain a morphology of the patterned quantum dot layer 12'.

For example, the temperature of the post-baking treatment is from 160° C. to 180° C. The post-baking treatment performed on the quantum dot layer 12 in the temperature range makes the surface of the quantum dot layer flatter. In a case that the boiling point of the photoinitiator is higher than the temperature of the pre-baking treatment and lower than the temperature of the post-baking treatment, the photoinitiator in the patterned quantum dot layer 12' is removed during the post-baking treatment, which prevents the quantum dots in the remaining portions of the patterned quantum dot layer 12' other than the preset portion 121 from being quenched in a case that the patterned quantum dot layer 12' is irradiated by light having the preset wavelength in subsequent process.

It should be noted that, in a case that the boiling point of the photoinitiator is higher than the temperature of the post-baking treatment, and after the post-baking treatment is completed, the patterned quantum dot layer 12' is further heated until the photoinitiator is removed.

For example, FIG. 3(a) to FIG. 3(e) are process diagrams of a patterning method of a quantum dot layer provided by another embodiment of the present disclosure. As illustrated in FIG. 3(a) to FIG. 3(e), the patterning method of the quantum dot layer is as follows.

Figure 3A:
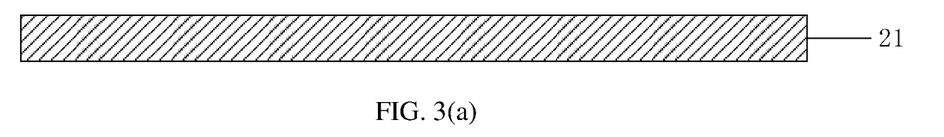
FIG. 3(a) to FIG. 3(e) are process diagrams of a patterning method of a quantum dot layer provided by another embodiment of the present disclosure.

As illustrated in FIG. 3(a), a base substrate 21 is provided.

For example, the base substrate 21 is a glass substrate, a quartz substrate or other substrate.

Figure 3B:
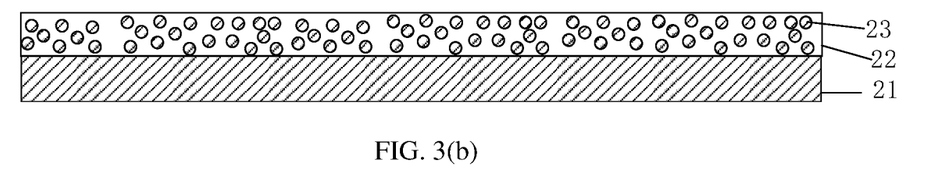

As illustrated in FIG. 3(b), a quantum dot layer 22 is formed on the base substrate 21.

For example, the quantum dot layer 22 is formed on the base substrate 21 by a coating method, a transferring method, a printing method or other method, and the quantum dot layer 22 comprises the quantum dots 23 and the photoinitiator (not illustrated in FIG. 3(b)).

Figure 3C:
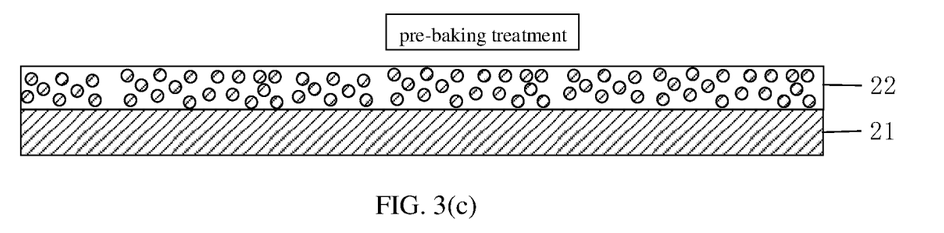

As illustrated in FIG. 3(c), a pre-baking treatment is performed on the quantum dot layer 22.

For example, the temperature of the pre-baking treatment for the quantum dot layer 22 is approximately from 60° C. to 80° C. The pre-baking treatment removes most of the solvent in the quantum dot layer 22 to ensure that the quantum dot layer 22 does not have fluidity and forms a basic layer structure.

Figure 3D:
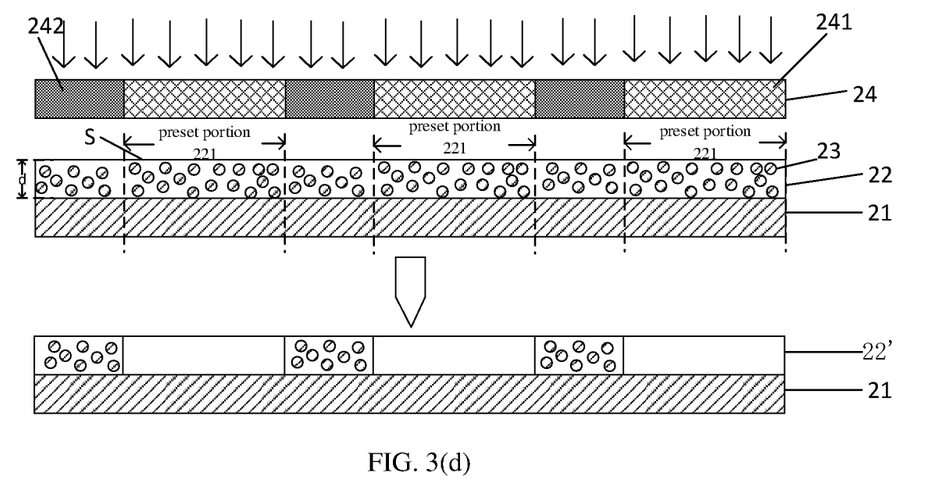

As illustrated in FIG. 3(d), in a case that the preset portion 221 of the quantum dot layer 22 is illuminated by light having the preset wavelength, a focal plane S and lower half of a focal depth (that is ½ focal depth) are adjusted, such that the focal plane S is located on an upper surface of the preset portion 221 of the quantum dot layer 22 along a thickness direction of the preset portion 221 of the quantum dot layer 22, and the ½ focal depth is a thickness d of the preset portion 221 of the quantum dot layer 22. Then, the preset portion 221 of the quantum dot layer 22 is irradiated by the light having the preset wavelength, and the quantum dots 23 in the preset portion 221 are quenched to form a patterned quantum dot layer 22'.

It is possible to accurately determine a region that irradiated by the light having the preset wavelength and avoid the waste of the light having the preset wavelength by using the step shown in FIG. 3(d). In addition, in a case that the boiling point of the photoinitiator is higher than the temperature of the post-baking treatment, additional heating step for removing the photoinitiator is saved. Furthermore, the focal plane S and the lower half of the focal depth (that is the ½ focal depth) may be adjustable while the preset portion 221 of the quantum dot layer 22 is illuminated by the light having the preset wavelength, in order to prevent the quantum dots of the active portion of the patterned quantum dot layer 12' from being quenched in a case that the patterned quantum dot layer 12' is irradiated by light having the preset wavelength in subsequent, which leads to the problem that the final display apparatus cannot display.

For example, in the step shown in FIG. 3(d), the quantum dot layer 22 is shielded by a mask plate 24, and the mask plate 24 comprises a light-transmitting region 241 and a light-shielding region 242, the light-transmitting region 241 corresponds to the preset portion 221 of the quantum dot layer 22, and the light-shielding region 242 corresponds to the remaining portions of the quantum dot layer 22 other than the preset portion 221. The method of illuminating the quantum dot layer 22 while shielding the quantum dot layer 22 by the mask plate 24 makes the pattern of the patterned quantum dot layer 22' more precise.

Figure 3E:
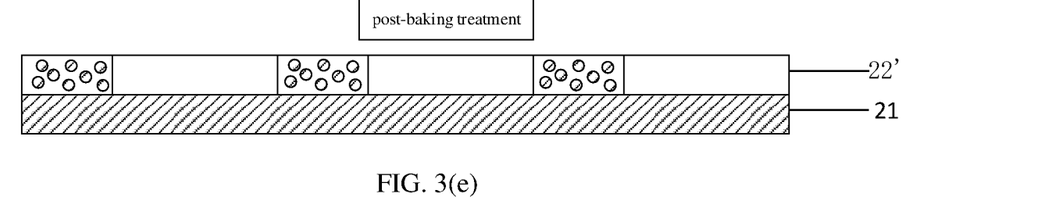

As illustrated in FIG. 3(e), a post-baking treatment is performed on the patterned quantum dot layer 22'.

For example, the post-baking treatment removes the residual solvents in the patterned quantum dot layer 22' to maintain a morphology of the patterned quantum dot layer 22'.

For example, the temperature of the post-baking treatment is from 160° C. to 180° C. The post-baking treatment performed on the patterned quantum dot layer 22' in the temperature range makes the surface of the quantum dot layer flatter. In a case that the boiling point of the photoinitiator is higher than the temperature of the pre-baking treatment and lower than the temperature of the post-baking treatment, the photoinitiator in the patterned quantum dot layer 22' is removed during the post-baking treatment, which prevents the quantum dots in the remaining portions of the patterned quantum dot layer 22' other than the preset portion 221 from being quenched in a case that the patterned quantum dot layer 22' is irradiated by light having the preset wavelength in subsequent process.

At least one embodiment of the present disclosure further provides a manufacturing method of a quantum dot device, and the manufacturing method comprises: forming a plurality of patterned quantum dot layers respectively by using any one of the patterning methods of the quantum dot layer in the above embodiments. The following is an example of forming two patterned quantum dot layers. The two patterned quantum dot layers comprise a first patterned quantum dot layer and a second patterned quantum dot layer. The manufacturing process of the first patterned quantum dot layer refers to the process diagrams of the patterning method of any one of the above quantum dot layers. What is described below is the process of manufacturing the second patterned quantum dot layer after the first patterned quantum dot layer is manufactured.

For example, FIG. 4(a) to FIG. 4(d) are process diagrams of a patterning method of a second quantum dot layer in a quantum dot device provided by an embodiment of the present disclosure. As illustrated in FIG. 4(a) to FIG. 4(d), the manufacturing process of the second patterned quantum dot layer is as follows.

Figure 4A:
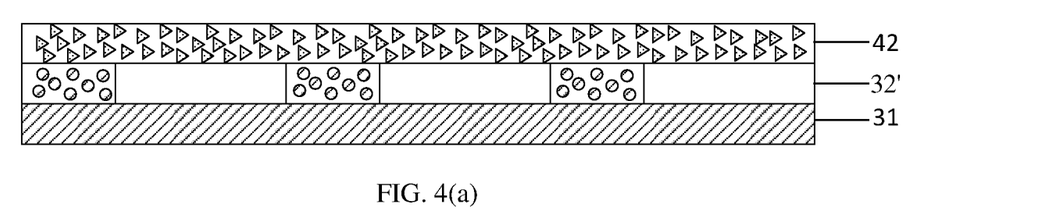
FIG. 4(a) to FIG. 4(d) are process diagrams of a patterning method of a second quantum dot layer in a quantum dot device provided by an embodiment of the present disclosure.

As illustrated in FIG. 4(a), a second quantum dot layer 42 is formed on a base substrate 31 on which a first patterned quantum dot layer 32' is formed.

Figure 4B:
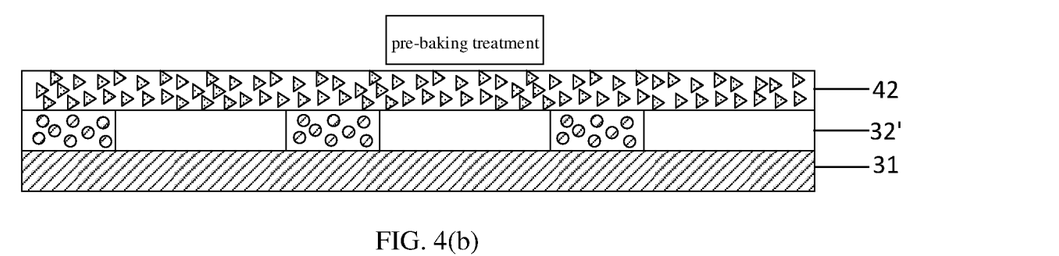

As illustrated in FIG. 4(b), a pre-baking treatment is performed on the second quantum dot layer 42.

Figure 4C:
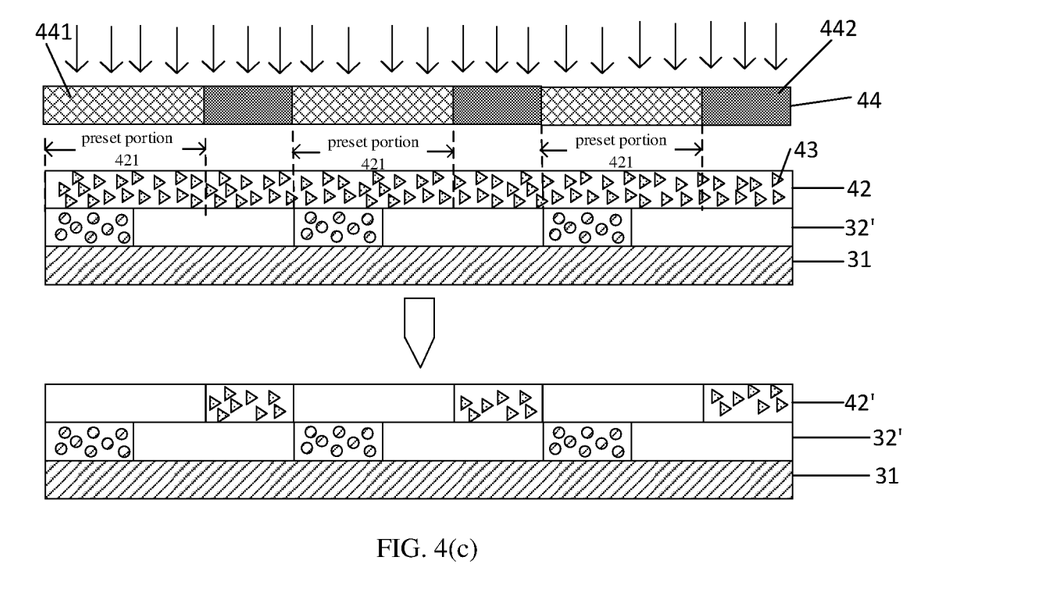

As illustrated in FIG. 4(c), a preset portion 421 of the second quantum dot layer 42 is irradiated by the light having a preset wavelength, and thus second quantum dots 43 in the preset portion 421 are quenched to form a second patterned quantum dot layer 42'.

For example, a second mask plate 44 is used to shield the second quantum dot layer 42, and the second mask plate 14 comprises a light-transmitting region 441 and a light-shielding region 442, the light-transmitting region 441 corresponds to the preset portion 421 of the second quantum dot layer 42, and the light-shielding region 442 corresponds to the remaining portions of the second quantum dot layer 42 other than the preset portion 421. The method of illuminating the second quantum dot layer 42 while shielding the second quantum dot layer 42 by the second mask plate 44 makes the pattern of the second patterned quantum dot layer 42' more precise.

Figure 4D:
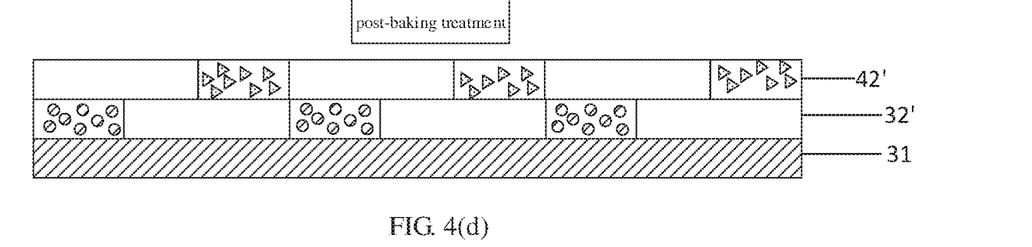

As illustrated in FIG. 4(d), a post-baking treatment is performed on the second patterned quantum dot layer 42'.

In a case that the boiling point of the photoinitiator is higher than the temperature of the pre-baking treatment and lower than the temperature of the post-baking treatment, the photoinitiator in the pattern of the second quantum dot layer 42 is removed during the post-baking treatment, which prevents the second quantum dots 43 in the remaining portions of the second quantum dot layer 42 other than the preset portion 421 from being quenched in a case that the pattern of the second quantum dot layer 12 is irradiated by light having the preset wavelength in subsequent process.

It should be noted that, in a case that the boiling point of the photoinitiator is higher than the temperature of the post-baking treatment, and after the post-baking treatment is completed, the pattern of the second quantum dot layer 42 is further heated until the photoinitiator is removed.

Figure 5:
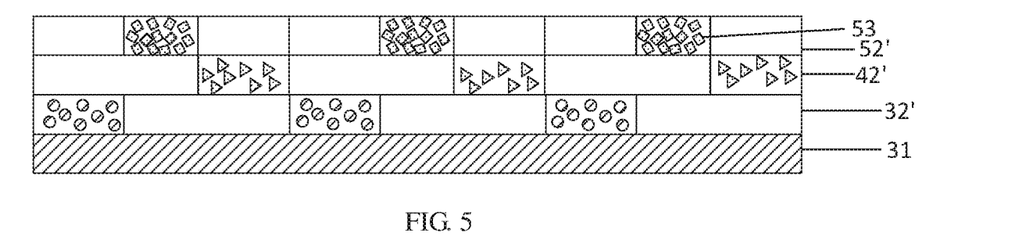
FIG. 5 is a schematic diagram of a cross-section structure of a quantum dot device comprising three layers of patterned quantum dot layers provided by an embodiment of the present disclosure.

For example, FIG. 5 is a schematic diagram of a cross-section structure of a quantum dot device comprising three patterned quantum dot layers provided by an embodiment of the present disclosure. As illustrated in FIG. 5, in a case that the three patterned quantum dot layers are stacked, a third quantum dot layer 52 is formed on the second patterned quantum dot layer 42', and then the steps in FIG. 4(a) to FIG. 4(d) mentioned above are repeated to form a third patterned quantum dot layer 52'.

In a case that the quantum dot device comprises more than two patterned quantum dot layers, the steps in FIG. 4(a) to FIG. 4(d) mentioned above are further repeated to form additional patterned quantum dot layers, which are omitted herein.

For example, FIG. 6(a) to FIG. 6(d) are process diagrams of a patterning method of a second patterned quantum dot layer in a quantum dot device provided by another embodiment of the present disclosure. As illustrated in FIG. 6(a) to FIG. 6(d), the manufacturing method of the second patterned quantum dot layer is as follows.

Figure 6A:
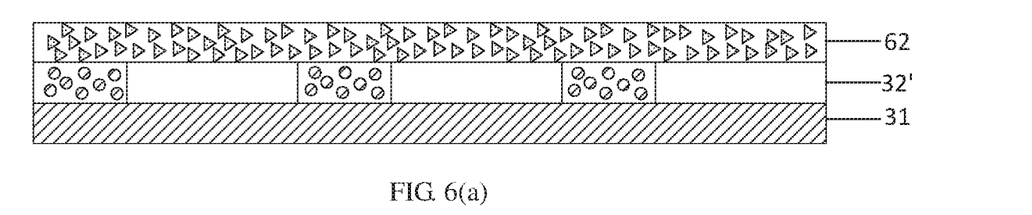
FIG. 6(a) to FIG. 6(d) are process diagrams of a patterning method of a second quantum dot layer in a quantum dot device provided by another embodiment of the present disclosure.

As illustrated in FIG. 6(a), a second quantum dot layer 62 is formed on a base substrate 31 on which a first patterned quantum dot layer 32' is formed.

Figure 6B:
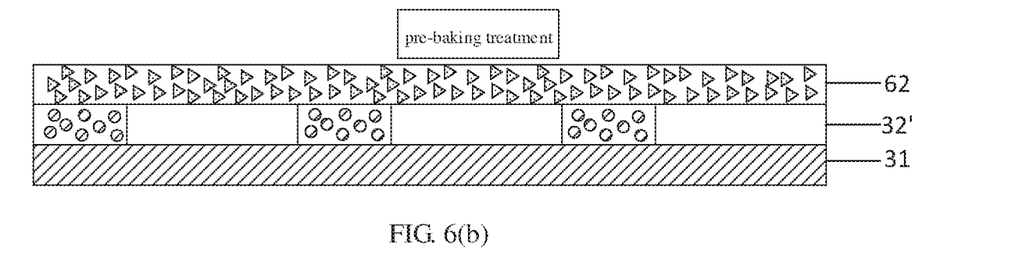

As illustrated in FIG. 6(b), a pre-baking treatment is performed on the second quantum dot layer 42.

Figure 6C:
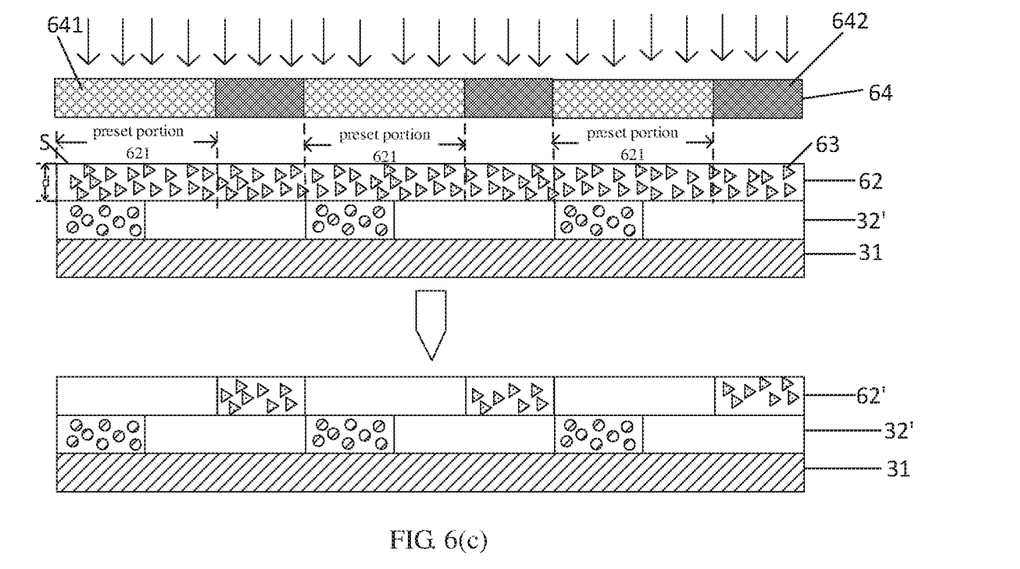

As illustrated in FIG. 6(c), in a case that the preset portion 621 of the second quantum dot layer 62 is illuminated by light having the preset wavelength, a focal plane S and lower half of a focal depth ((that is ½ focal depth) are adjusted, which makes that the focal plane S is located on an upper surface of the preset portion 621 of the second quantum dot layer 62 along a thickness direction of the preset portion 621 of the second quantum dot layer 62, and the ½ focal depth is a thickness d of the preset portion 621 of the second quantum dot layer 62. Then, the preset portion 621 of the second quantum dot layer 62 is irradiated by the light having the preset wavelength, and the second quantum dots 63 in the preset portion 621 are quenched to form a second patterned quantum dot layer 62'.

For example, a second mask plate 64 is used to shield the second quantum dot layer 62, and the second mask plate 64 comprises a light-transmitting region 641 and a light-shielding region 642, the light-transmitting region 641 corresponds to the preset portion. 621 of the second quantum dot layer 62, and the light-shielding region 642 corresponds to the remaining portions of the second quantum dot layer 62 other than the preset portion 621. The method of illuminating the second quantum dot layer 62 while shielding the second quantum dot layer 62 by the second mask plate 64 makes the pattern of the second patterned quantum dot layer 62' more precise.

Figure 6D:
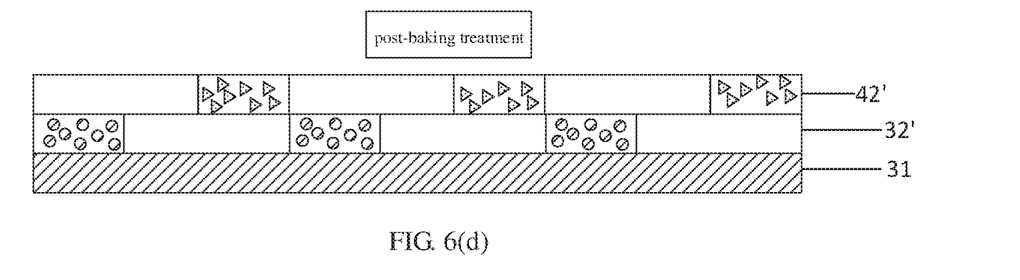

As illustrated in FIG. 6(d), a post-baking treatment is performed on the second patterned quantum dot layer 62'.

In a case that the boiling point of the photoinitiator is higher than the temperature of the pre-baking treatment and lower than the temperature of the post-baking treatment, the photoinitiator in the patterned quantum dot layer 62' is also removed in the process of the post-baking treatment. In a case that the boiling point of the photoinitiator is higher than the temperature of the post-baking treatment, additional heating step for removing the photoinitiator is saved. It is possible to accurately control a region that irradiated by the light having the preset wavelength by using the steps shown in FIG. 6(a) to FIG. 6(d). Thus, even if the photoinitiator in the second patterned quantum dot layer 62' is not removed, the light having the preset wavelength makes no influence on the second patterned quantum dot layer 62' in the subsequent process of forming the third patterned quantum dot layer, and the second quantum dots in the remaining portions of the second patterned quantum dot layer 62' other than the preset portion 621 are not quenched.

For example, in a case that the quantum dot device comprises more than two patterned quantum dot layers, the relevant descriptions of FIG. 6(a) to FIG. 6(d) mentioned above can be referred, which are omitted herein.

For example, the plurality of the patterned quantum dot layers are arranged in a stacked manner, and each of the patterned quantum dot layers comprises an inactive portion and an active portion, the inactive portion of each of the patterned quantum dot layers corresponds to the preset portion of the layer, and the active portion of each of the patterned quantum dot layers corresponds to the remaining portions of the quantum dot layer other than the preset portion of the layer.

For example, the active portions of the plurality of the patterned quantum dot layers are not overlapped with each other in a stacking direction of the plurality of the patterned quantum dot layers. For example, in the structure shown in FIG. 5, there is no overlapping region among the active portion of the first patterned quantum dot layer 32', the active portion of the second patterned quantum dot layer 42', and the active portion of the third patterned quantum dot layer 52'.

For example, colors of light emitted by the active portions of the plurality of the patterned quantum dot layers are different from each other. The following is an example of forming three patterned quantum dot layers. As illustrated in FIG. 5, the color of light emitted by third quantum dots 53 in the third patterned quantum dot layer 52' is different from the color of light emitted by first quantum dots in the first patterned quantum dot layer 32', and is also different from the color of light emitted by second quantum dots in the second patterned quantum dot layer 42'.

For example, the first patterned quantum dot layer comprises red quantum dots and the first patterned quantum dot layer emits red light, the second patterned quantum dot layer comprises green quantum dots and the second patterned quantum dot layer emits green light, and the third patterned quantum dot layer comprises blue quantum dots and the third patterned quantum dot layer emits blue light. It is understood that, the patterned quantum dot layer is able to emit light of other colors besides red, green and blue, such as yellow light. Accordingly, for example, the patterned quantum dot layer further comprises quantum dots that emit yellow light.

For example, the light having the preset wavelength is ultraviolet light, and the photoinitiator is an ultraviolet photoinitiator.

For example, the manufacturing method of the quantum dot device further comprises: forming a plurality of first electrodes spaced apart from each other before forming the plurality of the patterned quantum dot layers, and the active portions of the plurality of the patterned quantum dot layers overlap with the plurality of the first electrodes respectively in a stacking direction of the plurality of the patterned quantum dot layers.

For example, a material of the first electrode is a transparent conductive material, and the transparent conductive material comprises indium tin oxide (ITO), indium zinc oxide (IZO), indium gallium oxide (IGO), gallium zinc oxide (GZO), zinc oxide (ZnO), indium oxide ($In_2O_3$), alumina zinc (AZO) and carbon nanotubes.

For example, the active portions of the plurality of the patterned quantum dot layers overlap with the plurality of the first electrodes respectively, and interference between adjacent pixels is reduced in a case that light of different colors is emitted perpendicularly from the first electrodes.

For example, the manufacturing method of the quantum dot device further comprises: forming a second electrode to cover the plurality of the patterned quantum dot layers after forming the plurality of the patterned quantum dot layers.

For example, a material of the second electrode comprises magnesium single metal, aluminium single metal, lithium single metalb magnesium aluminium alloy (MgAl), or lithium aluminium alloy (LiAl) and so on.

For example, the first electrode is an anode and the second electrode is a cathode.

It should be noted that, the material and the structure of the first electrodes and the material and the structure of the second electrode described above are only examples of embodiments of the present disclosure. The first electrodes may be made of other materials, and the second electrode may be made of other materials. The quantum dot device is classified into a single-sided light-emitting quantum dot device and a double-sided light-emitting quantum dot device according to the material of the first electrodes and the material of the second electrode. In a case that the material of one of the anode and the cathode is opaque material or semi-transparent material, the quantum dot device is the single-sided light-emitting quantum dot device. In a case that both the material of the anode and the material of the cathode are transparent material and/or semi-transparent material, the quantum dot device is the double-sided light-emitting quantum dot device.

For the quantum dot device of the top emission type, the bottom emission type and the double-sided emission type, suitable materials of the first electrodes and suitable materials of the second electrode are selected as requirements, and the selection of the material of the first electrodes and the material of the second electrode are not limited in the embodiments of the present disclosure.

For example, the manufacturing method of the quantum dot device further comprises: forming an ultraviolet light isolation layer on at least a side of the plurality of the patterned quantum dot layers.

For example, the ultraviolet light isolation layer is formed by a coating process or a thin film deposition process.

For example, ultraviolet light has a shorter wavelength and higher energy, visible light has a longer wavelength and lower energy, and the ultraviolet light isolation layer ensures the transmittance of the visible light while absorbing the ultraviolet light.

For example, the material of the ultraviolet light isolation layer is inorganic compound or organic compound, the inorganic compound comprises titanium dioxide ($TiO_2$), zinc oxide (ZnO) or indium tin oxide (ITO), and the organic compound comprises benzotriazole compound.

For example, after forming the first electrodes and before forming the plurality of the patterned quantum dot layers, the manufacturing method of the quantum dot device further comprises: forming a hole transport layer on the first electrodes.

For example, the material of the hole transport, layer comprises at least one of the group consisting of N,N'-bis (1-naphthyl)-N,N'-diphenyl-1,1'-diphenyl-4,4'-diamine (NPB), 4,4',4'-tri(N-3-methylphenyl-N-phenyl amino)triphenylamine (m-MTDATA) and 4,4-2-[N-(4-carbazole phenyl)-N-phenyl amino] biphenyl (CPB), which are not limited to this, for example, a thickness of the hole transport layer is about 20 nm to 70 nm.

For example, before forming the hole transport layer on the first electrodes, the manufacturing method of the quantum dot device further comprises: forming a hole injection layer on the first electrodes.

For example, the hole injection layer is made of a metal oxide MeO, for example, molybdenum oxide ($MoO_3$), or a p-type doped metal oxide (MeO), such as MeO-TPD [N,N'10-bis(3-methylphenyl)-N,N'-diphenyl-1,1'-diphenyl-4,4'-diamine]: F4TCNQ (N,N,N'-tetramethoxyphenyl)-p-diaminobiphenyl: 2,3,5,6-tetrafluoro-7,7',8,8'-tetracyanato-p-benzoquinone) or m-MTDATA: F4TCNQ (4,4',4"-tri (N-3-methylphenyl-N-phenylamino)triphenylamine: 2,3,5,6-tetrafluoro-7,7', 8,8'-tetracyanato-p-benzoquinone) and so on, and a thickness of the hole injection layer is about 1 nm to 30 nm.

After forming the plurality of the patterned quantum dot layers, the manufacturing method of the quantum dot device further comprises: forming an electron transport layer on the plurality of the patterned quantum dot layers.

For example, the material of the electron transport layer comprises at least one of the group consisting of 4,7-diphenyl-1,10-phenanthrene(BPhen), 1,3,5-tris (1-phenyl-1H-benzimidazole-2-yl)benzene (TPBI) and n-type doped electron transport material, and the material of the electron transport layer is not limited to this. For example, a thickness of the electron transport layer is about 10 nm to 30 nm. The n-type doped electron transport material comprises 2,9-dimethyl-4,7-biphenyl-1,10-phenanthroline (BCP): $Li_2CO_3$, 8-hydroxyquinoline aluminum ($Alq_3$): Mg, TPBI: Li and so on, and the material of the electron transport layer is not limited to the above mentioned materials.

For example, before forming the electron transport layer on the plurality of the patterned quantum dot layers, the manufacturing method of the quantum dot device further comprises: forming an electron injection layer on the plurality of patterned quantum dot layers.

For example, the material of the electron injection layer comprises: lithium oxide ($Li_2O$), cesium oxide ($Cs_2O$), sodium oxide ($Na_2O$), lithium carbonate ($Li_2CO_3$), cesium carbonate ($Cs_2CO_3$), or sodium carbonate ($Na_2CO_3$), lithium fluoride (LiF), cesium fluoride (CsF), sodium fluoride (NaF), calcium fluoride ($CaF_2$), 8-hydroxyquinoline aluminum ($Alq_3$), 8-hydroxyquinoline lithium (Liq), 8-hydroxyquinoline 8-hydroxyquinoline gallium, his [2-(2-hydroxyphenyl-1)-pyridine] beryllium, 2-(4-diphenyl)-5-(4-tert-butylphenyl)-1,3,4-oxadiazole (PBD).

Figure 7:
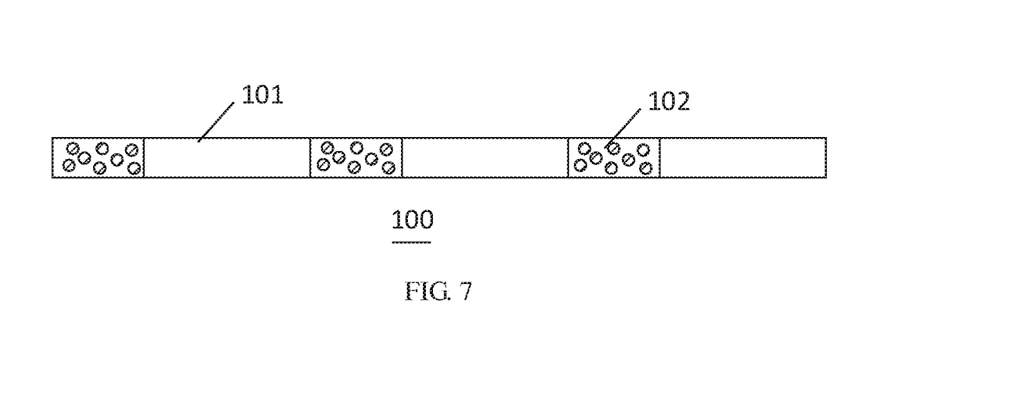
FIG. 7 is a schematic diagram of a cross-section structure of a quantum dot layer pattern provided by an embodiment of the present disclosure.

At least one embodiment of the present disclosure further provides a quantum dot layer pattern. For example, FIG. 7 is a schematic diagram of a cross-section structure of a quantum dot layer pattern provided by an embodiment of the present disclosure. As illustrated in FIG. 7, the quantum dot layer pattern 100 comprises an inactive portion 101 and an active portion 102, and quantum dots in the inactive portion are quenched.

For example, the active portion 102 of the quantum dot layer pattern 100 emits light of corresponding color normally. The inactive portion 101 of the quantum dot layer pattern 100 no longer has the ability to emit light.

Figure 8:
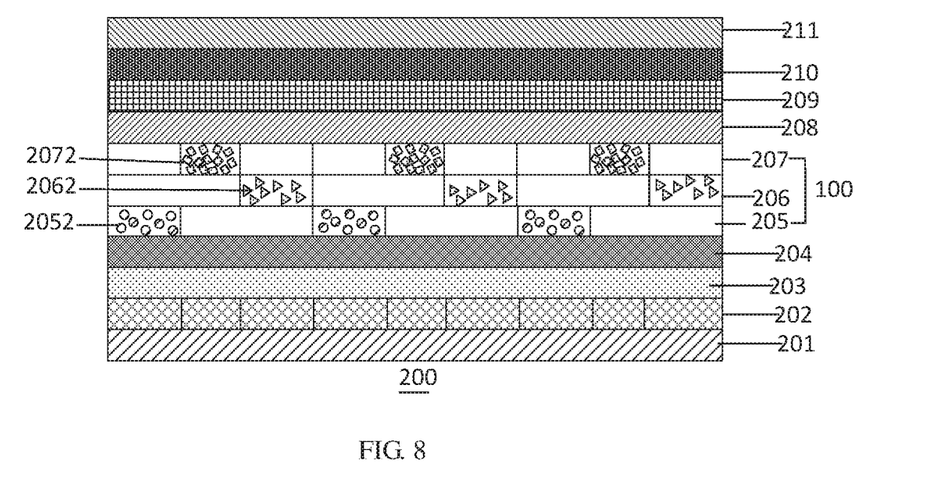
FIG. 8 is a schematic diagram of a cross-section structure of a quantum dot device provided by an embodiment of the present disclosure.

At least one embodiment of the present disclosure further provides a quantum dot device. For example, FIG. 8 is a schematic diagram of a cross-section structure of a quantum dot device provided by an embodiment of the present disclosure. As illustrated in FIG. 8, the quantum dot device 200 comprises: a plurality of quantum dot layer patterns 100 arranged in a stacked manner. As illustrated in FIG. 7, each of the quantum dot layer patterns 100 comprises the inactive portion 101 and the active portion 102, and the quantum dots in the inactive portion 101 are quenched.

Three quantum dot layer patterns 100 arranged in a stacked manner are taken as an example for illustration. As illustrated in FIG. 8, the quantum dot device 200 comprises a base substrate 201, and a first electrode 202, a hole injection layer 203, a hole transport layer 204, a first quantum dot layer pattern 205, a second quantum dot layer, a third quantum dot layer pattern 207, an electron transport layer 208, an electron injection layer 209, and a second electrode 210 which are sequentially disposed on the base substrate 201. The stacking of the first quantum dot layer pattern 205, the second quantum dot layer pattern 206, and the third quantum dot layer pattern 207 constitutes three quantum dot layer patterns 100.

For example, the active portions of the plurality of the patterned quantum dot layers overlap with the plurality of the first electrodes 202 respectively in a stacking direction of the plurality of the patterned quantum dot layers. For example, the active portion 2052 of the first quantum dot layer pattern 205, the active portion 2062 of the second quantum dot layer pattern 206 and the active portion 2072 of the third quantum dot layer pattern 207 overlaps with the first electrodes 202 spaced apart from each other respectively.

For example, the color of light emitted by the active portion 2052 of the first quantum dot layer pattern 205 is different from the color of light emitted by the active portion 2062 of the second quantum dot layer pattern 206, and is also different from the color of light emitted by the active portion 2072 of the third quantum dot layer pattern 207.

For example, the active, portion 2052 of the first quantum dot layer pattern 205, the active portion 2062 of the second quantum dot layer pattern 206 and the active portion 2072 of the third quantum dot layer pattern 207 are not overlapped with each other in the stacking direction of the first quantum dot layer pattern 205, the second quantum dot layer pattern 206 and the third quantum dot layer pattern 207.

For example, as illustrated in FIG. 8, the quantum dot device further comprises an ultraviolet light isolation layer 211 arranged on at least a side of the plurality of the patterned quantum dot layers. For example, the ultraviolet light isolation layer 211 is disposed on the second electrode 210. The ultraviolet light isolation layer 211 may also be arranged on an encapsulation layer formed in subsequent, which are not limited in the embodiment of the present disclosure, as long as the ultraviolet light isolation layer 211 can stop ultraviolet light from illuminating the quantum dot device and ensure the transmittance of visible light.

For example, the material of the ultraviolet light isolation layer is inorganic compound or organic compound, the inorganic compound comprises titanium dioxide ($TiO_2$), zinc oxide (ZnO) or indium tin oxide (ITO), and the organic compound comprises benzotriazole compound.

At least one embodiment of the present disclosure further provides a display apparatus, and the display apparatus comprises any one of the quantum dot devices mentioned above.

Figure 9:
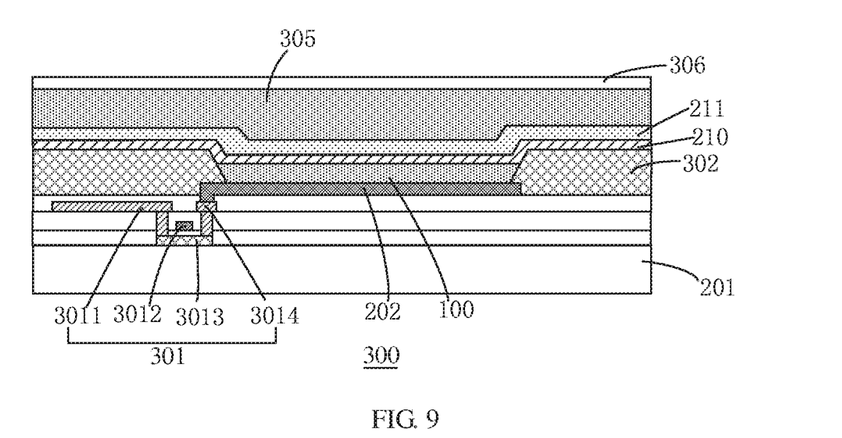
FIG. 9 is a schematic diagram of a cross-section structure of a display apparatus provided by an embodiment of the present disclosure.

For example, FIG. 9 is a schematic diagram of a cross-section structure of a display apparatus provided by an embodiment of the present disclosure. As illustrated in FIG. 9, the quantum dot device comprises a first electrode 202, a plurality of quantum dot layer patterns 100 arranged in a stacked manner, a second electrode 210, and an ultraviolet light isolation layer 211.

For example, as illustrated in HG 9, the display apparatus 300 further comprises a thin film transistor 301, the thin film transistor 301 is a driving transistor, and the thin film transistor 301 is arranged on a side of the first electrode 202 close to the base substrate 201. The driving transistor comprises a first source drain electrode 3011, a gate electrode 3012, an active layer 3013 and a second source drain electrode 3014, and the first electrode 202 is electrically connected with the second source drain electrode 3014. The structure of the thin film transistor 301 is not limited to this.

For example, as illustrated in FIG. 9, the display apparatus further comprises a pixel definition layer 302 disposed between the first electrode 202 and the second electrode 210, the pixel definition layer 302 is used to isolate two adjacent sub-pixel units.

For example, because water and oxygen have a great influence on the second electrode 210 and the plurality of the quantum dot layer patterns 100 disposed in a stacked manner, as illustrated in FIG. 9, the display apparatus 300 further comprises a passivation layer 305 and an encapsulation layer 306, which are arranged on the ultraviolet light isolation layer 211.

For example, the material of the passivation layer 305 is silicon nitride (SiNx), silicon oxide (SiOx) and acrylic resin.

For example, the material of the encapsulation layer 306 comprises silicon nitride, silicon oxide, or photosensitive resin, and the encapsulation layer 306 may be a single film or a composite film. For example, the photosensitive resin is polyacrylic acid resin, polyimide resin or polyimide resin.

For example, other structures of the display apparatus refer to the general designs. For example, the display apparatus is a mobile phone, a tablet computer, a television, a display, a notebook computer, a digital picture frame, a navigation system and any other product or component having a display function.

The patterning method of the quantum dot layer, the quantum dot layer pattern, the quantum dot device, the manufacturing method of the quantum dot device, and the display apparatus are provided by the embodiments of the present disclosure. The photoinitiator is added in the quantum dot layer, the mask plate is used to shield the quantum dot layer, and then light having the preset wavelength is used to irradiate the quantum dots in the preset portion of the quantum dot layer, to quench the quantum dots in the preset portion. The quantum dots shielded by the mask plate remains in the quantum dot layer and are used to form a fine pattern of the quantum dot light-emitting layer, and thus the colored quantum dot light-emitting device with a high pixel density is formed.

The following statements should be noted:

(1) the drawings of the embodiments of the present disclosure are only related to the structures mentioned in the embodiments of the present disclosure, and other structures can be further obtained by general designs;

(2) for the sake of clarity, in the drawings for describing the embodiments of the present disclosure, the size of a layer or a region are not drawn according to an actual scale but are exaggerated or diminished; it will be understood that when an element such as a layer, a film, a region or a substrate is referred to as being "on" or "under" another element, the element may be "directly" disposed "on" or "under" another element, or there may be an intermediate element interposed therebetween;

(3) the embodiments of the present disclosure and the features therein can be combined with each other to obtain new embodiments in the absence of conflicts.

What is described above is related to only the illustrative embodiments of the present disclosure and not limitative to the protection scope of the present application. The protection scope of the present application shall be defined by the accompanying claims.

What is claimed is:

1. A patterning method of a quantum dot layer, comprising:

forming a quantum dot layer, wherein the quantum dot layer comprises quantum dots and a photoinitiator;

irradiating a preset portion of the quantum dot layer by light having a preset wavelength to quench the quantum dots in the preset portion and form a patterned quantum dot layer, before the preset portion of the quantum dot layer is irradiated by the light having the preset wavelength, the patterning method further comprising: adjusting a focal plane and a focal depth of the preset portion of the quantum dot layer while the light having the preset wavelength irradiates the preset portion of the quantum dot layer, and wherein the focal plane is located on an upper surface of the preset portion of the quantum dot layer in a thickness direction of the preset portion of the quantum dot layer, and the focal depth is twice of a thickness of the preset portion of the quantum dot layer, and retaining the photoinitiator in a portion other than the preset portion of the quantum dot layer.

2. The patterning method of the quantum dot layer according to claim 1, further comprising: removing the photoinitiator in remaining portions of the quantum dot layer other than the preset portion after the preset portion of the quantum dot layer is irradiated by the light having the preset wavelength.

3. The patterning method of the quantum dot layer according to claim 2, further comprising:

performing a pre-baking treatment on the quantum dot layer before the preset portion of the quantum dot layer is irradiated by the light having the preset wavelength;

performing a post-baking treatment on the quantum dot layer after the preset portion of the quantum dot layer is irradiated by the light having the preset wavelength.

4. The patterning method of the quantum dot layer according to claim 3, wherein the photoinitiator in the remaining portions of the quantum dot layer other than the preset portion is removed by the post-baking treatment.

5. The patterning method of the quantum dot layer according to claim 4, wherein a boiling point of the photoinitiator is higher than a temperature of the pre-baking treatment and lower than a temperature of the post-baking treatment.

6. The patterning method of the quantum dot layer according to claim 1, wherein the irradiating the preset portion of the quantum dot layer by the light having the preset wavelength comprises: shielding the quantum dot layer by a mask plate, and the mask plate comprises a light-transmitting region and a light-shielding region, the light-transmitting region corresponds to the preset portion of the quantum dot layer, and the light-shielding region corresponds to the remaining portions of the quantum dot layer other than the preset portion.

7. The patterning method of the quantum dot layer according claim 1, wherein the light having the preset wavelength is ultraviolet light, and the photoinitiator is an ultraviolet photoinitiator.

8. The patterning method of the quantum dot layer according to claim 7, wherein a molecular formula of the photoinitiator is R1(CO)R2, where R1 comprises at least one selected from the group consisting of phenyl group, substituted phenyl group, aromatic group, and substituted aromatic group, and R2 comprises at least one selected from the group consisting of alkyl group and substituted alkyl group.

9. The patterning method of the quantum dot layer according to claim 8, wherein the photoinitiator comprises at least one selected from the group consisting of 2,2-diethoxyacetophenone, 1-hydroxycyclohexyl phenylketone, 2-hydroxy-2-methyl-1-phenyl-1-acetone, 2-methyl-1-(4-methylthiophenyl)-2-morpholine-1-acetone, 2-dimethylamino-2-benzyl-1-[4-(4-morpholinyl) phenyl]-1-butanone, and 2-hydroxy-2-methyl-1-[4-(2-hydroxyethyl)phenyl]-1-acetone.

10. A manufacturing method of a quantum dot device, comprising: forming a plurality of patterned quantum dot layers by the patterning method according to claim 1, wherein:
the plurality of the patterned quantum dot layers are arranged in a stacked manner, and
each of the plurality of patterned quantum dot layers comprises an inactive portion and an active portion, the inactive portion corresponds to the preset portion, and the active portion corresponds to remaining portions of the quantum dot layer other than the preset portion.

11. The manufacturing method of the quantum dot device according to claim 10, wherein:
colors of light emitted by the active portions of the plurality of the patterned quantum dot layers are different from each other; and
the active portions of the plurality of the patterned quantum dot layers are not overlapped with each other in a stacking direction of the plurality of the patterned quantum dot layers.

12. The manufacturing method of the quantum dot device according to claim 10, further comprising:
forming a plurality of first electrodes spaced apart from each other before the plurality of the patterned quantum dot layers are formed,
wherein the active portions of the plurality of the patterned quantum dot layers overlap with the plurality of the first electrodes respectively in a stacking direction of the plurality of the patterned quantum dot layers.

13. The manufacturing method of the quantum dot device according to claim 10, further comprising:
forming a second electrode to cover the plurality of the patterned quantum dot layers after the plurality of the patterned quantum dot layers are formed.

14. The manufacturing method of the quantum dot device according to claim 10, wherein:
the light having the preset wavelength is ultraviolet light, and the photoinitiator is an ultraviolet photoinitiator, and
the manufacturing method further comprises: forming an ultraviolet light isolation layer on at least a side of the plurality of the patterned quantum dot layers.

\* \* \* \* \*